(12) United States Patent
Yoon et al.

(10) Patent No.: US 9,711,762 B2
(45) Date of Patent: Jul. 18, 2017

(54) SUBSTRATE FOR ORGANIC LIGHT-EMITTING DIODE, METHOD FOR MANUFACTURING SAME, AND ORGANIC LIGHT-EMITTING DIODE COMPRISING SAME

(71) Applicant: Corning Precision Materials Co., Ltd., Chungcheongnam-do (KR)

(72) Inventors: Gun Sang Yoon, Chungcheongnam-do (KR); June Hyong Park, Chungcheongnam-do (KR); Il Hee Baek, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/912,002

(22) PCT Filed: Aug. 12, 2014

(86) PCT No.: PCT/KR2014/007494
§ 371 (c)(1),
(2) Date: Feb. 12, 2016

(87) PCT Pub. No.: WO2015/023112
PCT Pub. Date: Feb. 19, 2015

(65) Prior Publication Data
US 2016/0197314 A1 Jul. 7, 2016

(30) Foreign Application Priority Data

Aug. 14, 2013 (KR) .................. 10-2013-0096537

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0096* (2013.01); *H01L 51/5206* (2013.01);
(Continued)

(58) Field of Classification Search
CPC . H01L 51/56; H01L 51/0096; H01L 51/5206; H01L 51/5221; H01L 51/5268; H01L 2251/305; Y02E 10/549
(Continued)

(56) References Cited

U.S. PATENT DOCUMENTS 8,916,892 B2 12/2014 Jo et al.
2008/0297029 A1 12/2008 Cok
(Continued)

FOREIGN PATENT DOCUMENTS

CN 101711439 A 5/2010
CN 101765927 A 6/2010
(Continued)

OTHER PUBLICATIONS

Chang et al. ("Nano-particle based scattering layers for optical efficiency enhancement of organic light-emitting diodes and organic solar cells," J. of Applied Physics, 113, 204502-01_204502-08, 2013).*
(Continued)

*Primary Examiner* — Yasser A Abdelaziez
(74) *Attorney, Agent, or Firm* — Lerner, David, Littenberg, Krumholz & Mentlik, LLP

(57) ABSTRACT

The present invention relates to a substrate for an organic light-emitting diode, a method for manufacturing the same, and an organic light-emitting diode comprising the same, and more particularly, to a substrate for an organic light-emitting diode, the substrate having excellent productivity and manufacturing efficiency as well as an improved light extraction efficiency, a method for manufacturing the same,
(Continued)

and an organic light-emitting diode comprising the same. To this end, the present invention provides a substrate for an organic-light emitting diode, the substrate being disposed on one side of the organic light-emitting diode from which light irradiated thereby is emitted outside, the substrate comprising: a base plate; a light-scattering layer comprising a plurality of light-scattering particles, the light-scattering layer being formed on the base plate; and a transparent conductive film formed on the light-scattering layer, wherein a part of, or all of the pores formed between the plurality of light-scattering particles are filled with metal oxides forming the transparent conductive film; a method for manufacturing the same; and an organic light-emitting diode comprising the same.

12 Claims, 2 Drawing Sheets

(52) U.S. Cl.
CPC ...... *H01L 51/5221* (2013.01); *H01L 51/5268* (2013.01); *H01L 2251/305* (2013.01); *Y02E 10/549* (2013.01)

(58) Field of Classification Search
USPC .......................................................... 438/27
See application file for complete search history.

(56) References Cited

U.S. PATENT DOCUMENTS

| | | | |
|---|---|---|---|
| 2010/0207520 A1 | 8/2010 | Zhu et al. | |
| 2011/0180836 A1 | 7/2011 | Son | |
| 2012/0138937 A1 | 6/2012 | Jo et al. | |
| 2014/0014923 A1 | 1/2014 | Jang et al. | |
| 2014/0109965 A1* | 4/2014 | Goto | H01L 31/02168 136/259 |
| 2014/0182670 A1* | 7/2014 | Van Duren | C09D 5/006 136/256 |
| 2016/0084476 A1* | 3/2016 | Koole | C09K 11/02 362/84 |

FOREIGN PATENT DOCUMENTS

| | | |
|---|---|---|
| CN | 102165845 A | 8/2011 |
| CN | 102487128 A | 6/2012 |
| KR | 20120007472 A | 1/2012 |
| KR | 20120024358 A | 3/2012 |
| KR | 20120038214 A | 4/2012 |
| KR | 20120062374 A | 6/2012 |

OTHER PUBLICATIONS

Chinese Office Action for Application No. 201480049806.8 dated Nov. 18, 2016.

* cited by examiner

[ ZnO particle ]        [ SiO2 particle ]

SUBSTRATE FOR ORGANIC LIGHT-EMITTING DIODE, METHOD FOR MANUFACTURING SAME, AND ORGANIC LIGHT-EMITTING DIODE COMPRISING SAME

CROSS-REFERENCE TO RELATED APPLICATION

This application is a national phase entry under 35 U.S.C. §371 of International Application No. PCT/KR2014/007494, filed on Aug. 12, 2014, which claims priority to Korean Patent Application No. 10-2013-0096537, filed on Aug. 14, 2013, the disclosures of which are incorporated herein by reference.

BACKGROUND OF THE INVENTION

Field of the Invention

The present invention relates to a substrate for an organic light-emitting device, a method of fabricating the same and an organic light-emitting device including the same, and more particularly, a substrate for an organic light-emitting device which not only improves light extraction efficiency but also has superior productivity and fabrication efficiency, a method of fabricating the same and an organic light-emitting device including the same.

Description of Related Art

In general, light-emitting devices can be generally divided into organic light-emitting devices in which a light-emitting layer is formed from an organic matter and inorganic light-emitting devices in which a light-emitting layer is formed from an inorganic matter. An organic-light-emitting diode used in organic light-emitting devices is a self-emitting element which generates light using energy emitted from excitons that are generated through the recombination of electrons injected through a cathode and holes injected through an anode. Such organic light-emitting devices have a variety of advantages, such as, low-voltage driving, self-emission, a wide viewing angle, a high resolution, natural color reproduction and rapid response.

Recently, active studies are underway in order to apply organic light-emitting devices to a variety of devices, such as portable information devices, cameras, watches, office equipment, information display windows of vehicles, televisions (TVs), displays, or illumination systems.

Approaches for improving the luminous efficiency of organic light-emitting devices include an approach of improving the luminous efficiency of a material that constitutes a light-emitting layer and an approach of improving the light extraction efficiency at which light generated from the light-emitting layer is extracted.

The light extraction efficiency depends on the refractive indices of the layers which form an organic light-emitting device. In a typical organic light-emitting device, when a ray of light generated from the light-emitting layer is emitted at an angle greater than a critical angle, the ray of light is totally reflected at the interface between a higher-refractivity layer which could be a transparent electrode layer and a lower-refractivity layer which could be a substrate. This consequently lowers the light extraction efficiency, thereby lowering the overall luminous efficiency of the organic light-emitting device, which is problematic.

More specifically, only about 20% of light generated from an organic light-emitting diode is emitted to the outside and about 80% of the light is lost by a waveguide effect originating from the difference in the refractive index between a glass substrate and an organic light-emitting diode which includes an anode, a hole injection layer, a hole transport layer, an emissive layer, an electron transport layer and an electron injection layer, as well as by the total internal reflection originating from the difference in the refractive index between the glass substrate and the air. Here, the refractive index of the internal organic light-emitting layer ranges from 1.7 to 1.8, whereas the refractive index of indium tin oxide (ITO) which is generally used for the anode is about 1.9. Since the two layers have a very small thickness ranging from 200 to 400 nm and the refractive index of the glass used for the glass substrate is about 1.5, a planar waveguide is thereby formed inside the organic light-emitting device. It is calculated that the ratio of the light lost in the internal waveguide mode due to the above-described reason is about 45%. In addition, since the refractive index of the glass substrate is about 1.5 and the refractive index of the ambient air is 1.0, when the light is directed outward from the inside of the glass substrate, a ray of the light having an angle of incidence greater than a critical angle is totally reflected and is trapped inside the glass substrate. The ratio of the trapped light is about 35%. Therefore, only about 20% of the generated light is emitted to the outside.

In order to overcome this, a variety of methods for improving light extraction efficiency has been studied. For example, a planarization layer having an intermediate refractive index, as an antireflection film, is provided between a glass substrate and a light-emitting structure, or a partition wall in which white particulates or transparent particulates is dispersed in polymer, as an optical waveguide, is provided on a substrate, the refractive index of the transparent particulates being different from that of the polymer.

A typical technology for light extraction is to coat a substrate with a light-scattering layer including scattering particles. That is, metal oxide particles are contained in a matrix to act as scattering particles, whereby a light scattering effect can be expected at the boundaries between the metal oxide particles and the matrix and from the difference in the refractive index therebetween.

The light-scattering layer is fabricated typically by a wet coating method, such as spin coating or bar coating. However, the wet coating causes some problems.

It is difficult to uniformly disperse the metal oxide particles in the matrix by the wet coating method. According to the characteristics of the wet coating, the volume of the liquid matrix decreases by $\frac{1}{5}$ to $\frac{1}{20}$ during the baking process. Then, some of the metal oxide particles remaining in the matrix protrude from the surface of the matrix when the volume of the matrix decreases, thereby increasing the surface roughness of the matrix. This consequently has an adverse effect on the characteristics of the organic light-emitting device.

In addition, in the related art, after fabrication of a light extraction layer in which the scattering particles are disposed inside the matrix by the above-mentioned wet coating method, a planarization layer which reduces the surface roughness of the matrix layer is disposed on the matrix for the reliability of an organic light-emitting device. Afterwards, a transparent electrode, an organic light-emitting layer and a metal electrode are sequentially deposited on the resultant structure by a dry process.

Since the deposition process for the light extraction layer and the deposition process for the organic light-emitting diode are carried out by different processes in the related art, some handling is required between the two processes. This handling between the processes causes a problem to the organic light-emitting device, the efficiency of which is significantly sensitive to a minute defect.

The information disclosed in the Background of the Invention section is provided only for better understanding of the background of the invention and should not be taken as an acknowledgment or any form of suggestion that this information forms a prior art that would already be known to a person skilled in the art.

RELATED ART DOCUMENT

Patent Document 1: Korean Patent Application Publication No. 10-2012-0038214 (Apr. 23, 2012)

BRIEF SUMMARY OF THE INVENTION

Various aspects of the present invention provide a substrate for an organic light-emitting device which not only improves light extraction efficiency but also has superior productivity and fabrication efficiency, a method of fabricating the same and an organic light-emitting device including the same.

In an aspect of the present invention, provided is a substrate for an organic light-emitting device which is disposed on one surface of the organic light-emitting device through which light from the organic light-emitting device is emitted. The substrate includes: a base substrate; a light-scattering layer disposed on the base substrate, the light-scattering layer including a number of light-scattering particles; and a transparent conductive film disposed on the light-scattering layer. A metal oxide that forms the transparent conductive film fills all or parts of a number of pores between the number of light-scattering particles.

According to an embodiment of the present invention, the transparent conductive film may serve as a transparent electrode of the organic light-emitting device.

The transparent conductive film may be formed from ZnO to which a dopant is added.

The light-scattering particles may be formed from at least one selected from the group consisting of ZnO, $SiO_2$ and $TiO_2$.

The diameters of the light-scattering particles may range from 50 to 500 nm.

In another aspect of the present invention, provided is a method of fabricating a substrate for an organic light-emitting device which is disposed on one surface of the organic light-emitting device through which light from the organic light-emitting device is emitted. The method includes a first dry deposition step of forming a light-scattering layer by depositing light-scattering particles on a base substrate by dry deposition; and a second dry deposition step of forming a transparent conductive film by depositing a conductive metal oxide on the light-scattering layer by dry deposition.

According to an embodiment of the present invention, at the first dry deposition step, the light-scattering particles may be deposited on the base substrate using a precursor and an oxidizer, the precursor being selected from the group consisting of a ZnO precursor of diethyl zinc (DEZ), a $SiO_2$ precursor of tetraethyl orthosilicate (TEOS) and a $TiO_2$ precursor of titanium isoproxide (TTIP).

At the first dry deposition step, the oxidizer may be at least one of vapor of $H_2O$ and ozone.

At the first dry deposition step, a deposition temperature may be controlled to be in the range from 300 to 500° C.

In addition, at the second dry deposition step, the conductive metal oxide may be deposited on the light-scattering layer using an organic solvent of hydrocarbon, a ZnO precursor of diethyl zinc or dimethyl zinc and an oxidizer, the ZnO precursor being diluted in the organic solvent.

At the second dry deposition step, the oxidizer may be at least one of vapor of $H_2O$ and ethanol.

At the second dry deposition step, a deposition temperature may be controlled to be in the range from 250 to 550° C.

The second dry deposition step may include adding a dopant to the metal oxide.

The dry deposition may be chemical vapor deposition (CVD).

The chemical vapor deposition may be atmospheric pressure chemical vapor deposition (APCVD).

The first dry deposition step and the second dry deposition step may be continuously carried out in-line on a conveyor belt.

In a further aspect of the present invention, provided is an organic light-emitting device that includes: a base substrate; a light-scattering layer disposed on the base substrate, the light-scattering layer including a number of light-scattering particles; an anode disposed on the light-scattering layer, the anode being formed from a transparent conductive film; an organic light-emitting layer disposed on the anode; and a cathode disposed on the organic light-emitting layer. A metal oxide that forms the transparent conductive film fills all or parts of a number of pores between the number of light-scattering particles.

According to embodiments of the present invention, since light-scattering particles and a transparent conductive film (TCO) are continuously deposited in-line on a base substrate in a dry deposition process, it is possible to improve productivity and efficiency in the fabrication of a substrate for an organic light-emitting device. In particular, since the transparent conductive film which serves as the anode of the organic light-emitting device is formed at the step of fabricating the substrate, it is possible to simplify future diode fabrication processes.

In addition, since the light-scattering particles form a layer in front of the organic light-emitting diode, it is possible to improve the light extraction efficiency of the organic light-emitting device.

Furthermore, the light-scattering particles can be uniformly dispersed on the base substrate by atmospheric pressure chemical vapor deposition (APCVD).

In addition, since the light-scattering particles are bonded to the base substrate via the transparent conductive film deposited by APCVD, it is possible to achieve structural stability.

Furthermore, since the transparent conductive film serves as both a matrix layer for the light-scattering particles and the electrode of the organic light-emitting device, it is possible to dispense with the related-art planarization layer disposed on one surface of the organic light-emitting device that is in contact with the transparent electrode, thereby simplifying the fabrication process. Since the planarization layer is omitted, the light-scattering particles are disposed closer to the organic light-emitting layer of the organic light-emitting device, whereby the ability of the light-scattering particles to improve light extraction efficiency can be further enhanced.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
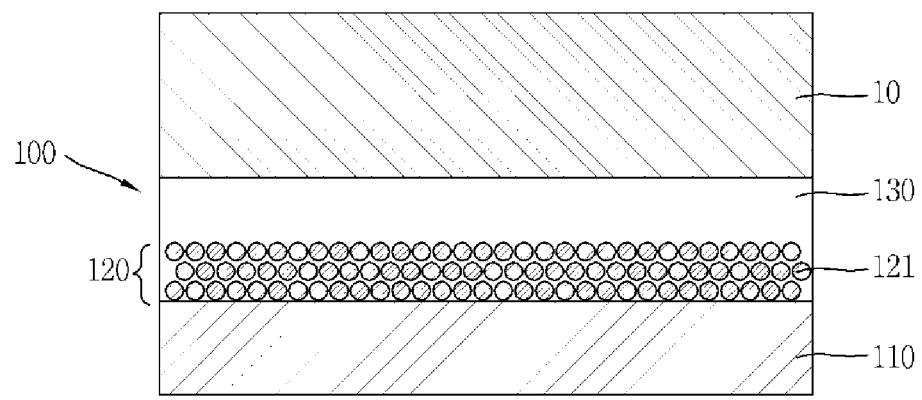
FIG. 1 is a cross-sectional view showing a substrate for an organic light-emitting device according to an exemplary embodiment of the present invention, the substrate being disposed on one surface of an organic light-emitting device through which light from the organic light-emitting device is emitted.

Reference will now be made in detail to a substrate for an organic light-emitting device, a method of fabricating the same and an organic light-emitting device including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, a substrate 100 for an organic light-emitting device according to an exemplary embodiment is disposed on one surface of an organic light-emitting device through which light from the organic light-emitting device is emitted in order to improve the light extraction efficiency of the organic light-emitting device. The substrate 100 for the organic light-emitting device includes a base substrate 110, a light-scattering layer 120 and a transparent conductive film 130.

Although not specifically shown, the organic light-emitting diode 10 has a multilayer structure in which an anode, an organic light-emitting layer and a cathode are sandwiched between the base substrate 110 according to this exemplary embodiment and another substrate that faces the base substrate 110. In this case, the transparent conductive film 130 according to this exemplary embodiment serves as the anode, i.e. the transparent electrode of the organic light-emitting diode 10. According to this exemplary embodiment, the anode can be formed from ZnO to which a dopant is added. In addition, the cathode can be formed from a metal thin film of Al, Al:Li or Mg:Ag which has a smaller work function in order to facilitate the electron injection. The organic light-emitting layer can includes a hole injection layer, a hole transport layer, an emissive layer, an electron transport layer and an electron injection layer which are sequentially stacked on the anode. When the organic light-emitting diode 10 according to this exemplary embodiment is a white organic light-emitting diode that is applied for lighting, the light-emitting layer can have, for example, a multilayer structure that includes a high-molecular light-emitting layer which emits blue light and a low-molecular light-emitting layer which emits orange-red light. The light-emitting layer can also have a variety of other structures to emit white light. In addition, the organic light-emitting diode 10 can have a tandem structure. Specifically, the organic light-emitting diode 10 can include a plurality of organic light-emitting layers and interconnecting layers which alternate with the organic light-emitting layers.

With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

The base substrate 110 supports the light-scattering layer 120 and the transparent conductive film 130 which are disposed on one surface thereof. The base substrate 110 also serves as an encapsulation substrate which is disposed on one surface of the organic light-emitting device through which light from the organic light-emitting device is emitted, in order to allow the light from the organic light-emitting device to exit while protecting the organic light-emitting diode 10 from the external environment.

The base substrate 110 may be any transparent substrate that has superior light transmittance and mechanical properties. For example, the base substrate 110 can be formed from a polymeric material, such as a heat or ultraviolet (UV) curable organic film, or a chemically strengthened glass, such as a soda-lime glass ($SiO_2$—CaO—$Na_2O$) or an aluminosilicate glass ($SiO_2$—$Al_2O_3$—$Na_2O$)). When the organic light-emitting device including the organic light-emitting diode 10 and the light extraction substrate 100 according to this exemplary embodiment is applied for lighting, the base substrate 110 can be formed from the soda-lime glass. The base substrate 110 may be a substrate that is formed from a metal oxide or a metal nitride. The base substrate 110 can be formed from a piece of thin glass having a thickness of 1.5 mm or less. The thin glass can be made by a fusion process or a floating process.

The light-scattering layer 120 is disposed on the base substrate 110. The light-scattering layer 120 is formed as a layer of a number of light-scattering particles 121 which is uniformly distributed. The light-scattering layer 120 serves to improve the light extraction efficiency of the organic light-emitting device by diversifying paths along which the light from the organic light-emitting device is emitted. According to this exemplary embodiment, the scattering layer 120 is closer to the organic light-emitting layer of the organic light-emitting diode 10 than in the related art since the transparent conductive film 130 serving as the anode of the organic light-emitting diode 10 is directly disposed on the light-scattering layer 120. Accordingly, the ability of the light-scattering layer 120 to improve light extraction efficiency by scattering light can be further enhanced.

The light-scattering layer 120 according to this exemplary embodiment is the layer in which the number of light-scattering particles 121 are arranged. The bonding force between the light-scattering layer 120 and the base substrate 110 is maintained only by van der Waals force. Pores are formed between the light-scattering particles 121. Some or all of the pores can be filled with ZnO, the metal oxide of the transparent conductive film 130. The bonding between the ZnO and the base substrate 110 allows the light-scattering layer 120 to more reliably maintain its shape on the base substrate 110. The phenomenon in which the pores of the light-scattering layer 120 are filled with the metal oxide of the transparent conductive film 130 occurs during the process of forming the transparent conductive film 130 on the light-scattering layer 120 by chemical vapor deposition (CVD). This will be described in more detail later in relation to the method of fabricating an substrate for an organic light-emitting device. The remaining pores that are not filled with the ZnO serve to scatter light like the light-scattering particles 121.

According to this exemplary embodiment, the number of light-scattering particles 121 can be formed from at least one selected from among, but not limited to, ZnO, $SiO_2$ and $TiO_2$. The diameters of the light-scattering particles 121 may range from 50 to 500 nm. It is preferred that the light-scattering particles 121 have a variety of diameters within this range in order to realize a better light-scattering effect.

The transparent conductive film 130 is disposed on the light-scattering layer 120. The metal oxide of the transparent conductive film 130 occupies some of the pores defined between the light-scattering particles 121 of the light-scattering layer 120, and during this process, comes into contact with the base substrate 110. In the structural aspect, the light-scattering layer 120 is disposed inside the transparent conductive film 130, more particularly, inside the lower layer portion of the transparent conductive film 130 which forms the boundary to the base substrate 110. In addition, the upper layer of the transparent conductive film 130 is made only of the metal oxide. Accordingly, the transparent conductive film 130 has dual structural roles as a matrix layer which fixes the light-scattering particles 121 therein and as the anode of the organic light-emitting diode 10. Since the substrate 100 for the organic light-emitting device according to this exemplary embodiment is provided with the transparent conductive film 130 which serves as the anode of the organic light-emitting diode 10, the fabrication process for the organic light-emitting diode 10 can be simplified.

The transparent conductive film 130 according to this exemplary embodiment can be formed from ZnO to which a dopant is added. The dopant can be, for example, Ga or Al.

A description will be given below of the method of fabricating an substrate for organic light-emitting device with reference to FIG. 2.

The method of fabricating the substrate for the organic light-emitting device includes a first dry deposition step and a second dry deposition step.

Figure 2:
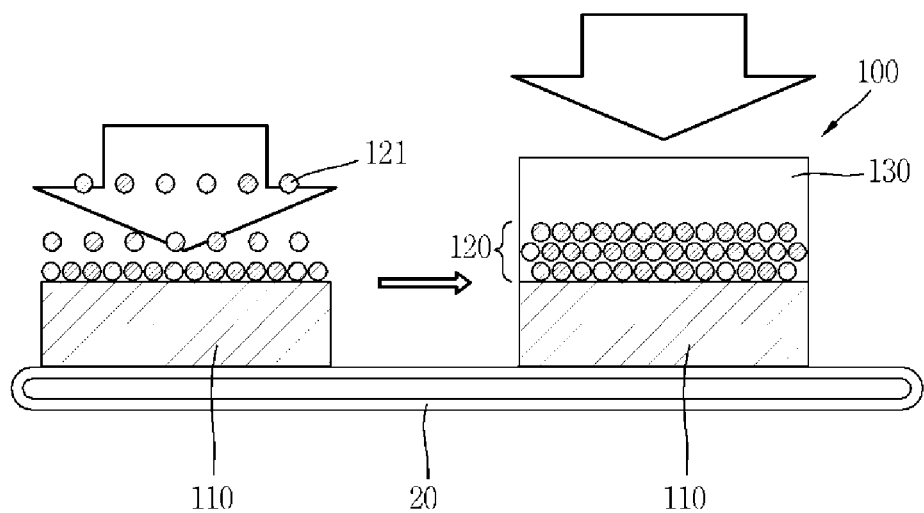
FIG. 2 is a schematic view showing the processes of a method of fabricating the substrate for the organic light-emitting device according.
Figure 3:
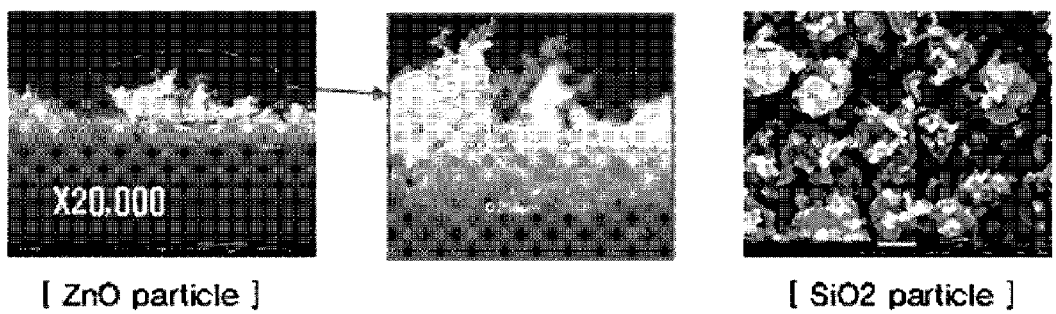
FIG. 3 is electron microscopy pictures showing light-scattering layers.

First, as shown in FIG. 2, the first dry deposition step is carried out by forming a light-scattering layer 120 by depositing light-scattering particles 121 on a base substrate 110 by a dry deposition process. The dry deposition process can be chemical vapor deposition (CVD). In particular, according to this exemplary embodiment, the first dry deposition step can be carried out by atmospheric pressure chemical vapor deposition (APCVD). Accordingly, at the first dry deposition step, first, the base substrate 110 is loaded into a deposition chamber (not shown). The base substrate 110 can be heated in order to improve the deposition efficiency of the light-scattering particles 121. Afterwards, one selected from among a ZnO precursor of diethyl zinc (DEZ), a $SiO_2$ precursor of tetraethyl orthosilicate (TEOS) and a $TiO_2$ precursor of titanium isoproxide (TTIP) and an oxidizer which are supposed to form the light-scattering particles 121 are supplied into a deposition chamber (not shown). The oxidizer can be at least one of vapor ($H_2O$) and ozone ($O_3$). At the first dry deposition step, it is preferred that the deposition temperature be controlled to be in the range from 300 to 500° C. When the light-scattering particles 121 are deposited on the base substrate 110 by APCVD at the first dry deposition step, a number of the light-scattering particles 121 is uniformly distributed on the base substrate 110 and forms into a layer, whereby the light-scattering layer 120 is made. FIG. 3 is electron microscopy pictures showing light-scattering layers that are deposited by this process.

Afterwards, the second dry deposition step is carried out by forming a transparent conductive film 130 by depositing a conductive metal oxide on the light-scattering layer 120 by APCVD as at the first dry deposition step. At the second dry deposition step, the base substrate 110 which was initially loaded into the deposition chamber (not shown) for the first dry deposition step continues to be positioned on a conveyor belt 20 inside the deposition chamber (not shown). Accordingly, after the first dry deposition step, the base substrate 110 with the light-scattering layer 120 formed thereon is carried on the conveyor belt 20 for the second dry deposition step. According to this exemplary embodiment, the first dry deposition step and the second dry deposition step are continuously carried out in-line using the conveyor belt 20. This can consequently improve productivity in the fabrication of a substrate 100 for an organic light-emitting device.

Figure 4:
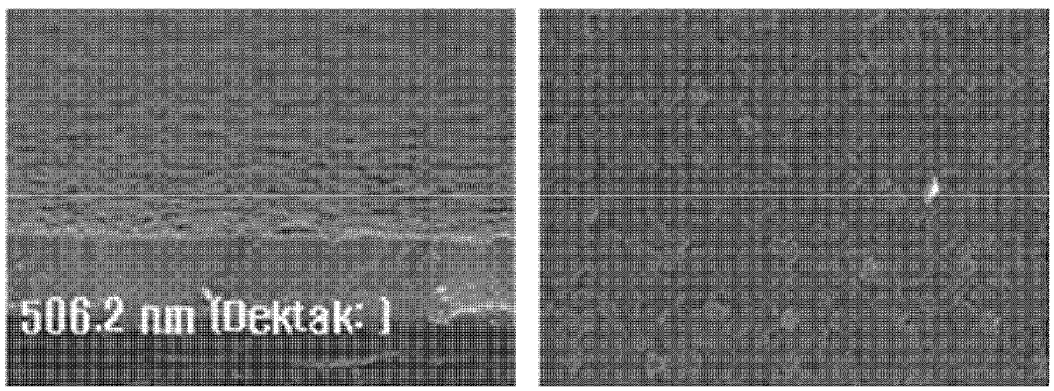
FIG. 4 is electron microscopy pictures showing transparent conductive layers.

At the second dry deposition step, the base substrate 110 can be heated as at the first dry deposition step. Afterwards, according to this exemplary embodiment, an organic solvent of hydrocarbon such as oxtane is supplied, together with a ZnO precursor which are diluted in the organic solvent and an oxidizer, into the deposition chamber (not shown). The ZnO precursor may be diethyl zinc (DEZ) or dimethyl zinc (DMZ). The oxidizer can be at least one of vapor ($H_2O$) and ethanol. In addition, at the second dry deposition step, it is preferred that the deposition temperature be controlled to be in the range from 250 to 550° C. Since this exemplary embodiment forms the transparent conductive film 130 serving as the anode of the organic light-emitting diode (10 in FIG. 1) on the light-scattering layer 120, ZnO may be doped by injecting a dopant into the deposition chamber (not shown) while ZnO is being deposited or by ion implantation after the deposition of ZnO. The dopant can be Ga or Al. FIG. 4 is electron microscopy pictures showing transparent conductive layers that are formed by this process.

In the process of depositing the transparent conductive film 130 on the light-scattering layer 120, the material that forms the transparent conductive film 130, i.e. ZnO, can be disposed between the number of light-scattering particles 121. This leads to a configuration in which the light-scattering layer 120 is disposed inside the transparent conductive film 130. Thus, the light-scattering layer 120 which otherwise is fixed to the upper surface of the base substrate 110 only by van der Waals force can be more reliably fixed thereto, thereby achieving structural stability.

When the second dry deposition step is completed in this manner, the substrate 100 for the organic light-emitting device according to this exemplary embodiment is fabricated.

As set forth above, the method of fabricating the substrate for the organic light-emitting device can continuously deposit the light-scattering particles 121 and the transparent conductive film 130 on the base substrate 110 by the in-line process of the dry deposition process such as CVD, thereby improving productivity and efficiency in the fabrication of the substrate 100. It is also possible to form the transparent conductive film 130 which serves as the anode of the organic light-emitting diode (10 in FIG. 1) and the matrix layer of the light-scattering particles 121, thereby simplifying future diode fabrication processes.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a substrate for an organic light-emitting device, the method comprising:
   forming a light-scattering layer by depositing light-scattering particles on a base substrate which is disposed on one surface of an organic light-emitting device through which light from the organic light-emitting device is emitted by dry deposition such that a number of pores are formed between the light-scattering particles, wherein the light-scattering particles are deposited on the base substrate using a precursor and an oxidizer, the precursor being selected from the group consisting of a ZnO precursor of diethyl zinc, a $SiO_2$ precursor of tetraethyl orthosilicate and a $TiO_2$ precursor of titanium isoproxide; and
   forming a transparent conductive film by depositing a conductive metal oxide on the light-scattering layer by dry deposition such that the conductive metal oxide fills all or parts of the number of pores between the light-scattering particles.

2. The method according to claim 1, wherein the oxidizer comprises at least one of vapor of $H_2O$ and ozone.

3. The method according to claim 1, wherein the process of depositing light-scattering particles on the base substrate comprises controlling a deposition temperature to be in a range from 300 to 500° C.

4. The method according to claim 1, wherein the conductive metal oxide is deposited on the light-scattering layer using an organic solvent of hydrocarbon, a ZnO precursor of diethyl zinc or dimethyl zinc and an oxidizer, the ZnO precursor being diluted in the organic solvent.

5. The method according to claim 4, wherein the oxidizer used at the process of depositing the conductive metal oxide on the light-scattering layer comprises at least one of vapor of $H_2O$ and ethanol.

6. The method according to claim 1, wherein depositing the conductive metal oxide on the light-scattering layer comprises controlling a deposition temperature to be in a range from 250 to 550° C.

7. The method according to claim 1, wherein depositing the conductive metal oxide on the light-scattering layer comprises adding a dopant to the conductive metal oxide.

8. The method according to claim 1, wherein the dry deposition comprises chemical vapor deposition.

9. The method according to claim 8, wherein the chemical vapor deposition comprises atmospheric pressure chemical vapor deposition.

10. The method according to claim 1, wherein depositing the light-scattering particles on the base substrate and depositing the conductive metal oxide on the light-scattering layer are continuously carried out in-line on a conveyor belt.

11. The method according to claim 1, wherein the transparent conductive film serves as a transparent electrode of the organic light-emitting device.

12. The method according to claim 1, wherein diameters of the light-scattering particles range from 50 to 500 nm.

* * * * *